United States Patent [19]
Youn

[11] Patent Number: 6,017,801
[45] Date of Patent: Jan. 25, 2000

[54] METHOD FOR FABRICATING FIELD EFFECT TRANSISTOR

[75] Inventor: Kang-Sik Youn, Chungcheongbuk-do, Rep. of Korea

[73] Assignee: LG Semicon Co., Ltd., Chungcheongbuk-Do, Rep. of Korea

[21] Appl. No.: 09/006,479

[22] Filed: Jan. 13, 1998

[30] Foreign Application Priority Data

Sep. 24, 1997 [KR] Rep. of Korea ..................... 97/48550

[51] Int. Cl.⁷ ........................ H01L 21/762; H01L 21/336
[52] U.S. Cl. ........................... 438/296; 438/424; 438/525
[58] Field of Search .................................. 257/397, 623, 257/624, 232, 354, 513; 438/421, 296, 424, 524, 525, FOR 227

[56] References Cited

U.S. PATENT DOCUMENTS

| | | |
|---|---|---|
| 4,528,744 | 7/1985 | Shibata . |
| 4,716,128 | 12/1987 | Schubert et al. . |
| 4,786,955 | 11/1988 | Plus et al. . |
| 4,830,971 | 5/1989 | Shibata . |
| 4,966,861 | 10/1990 | Mieno et al. . |
| 5,384,473 | 1/1995 | Yoshikawa et al. . |
| 5,824,586 | 10/1998 | Wollesen . |
| 5,849,621 | 12/1998 | Gardner et al. . |

*Primary Examiner*—George Fourson
*Attorney, Agent, or Firm*—Morgan, Lewis & Bockius LLP

[57] ABSTRACT

A semiconductor device and a method for fabricating the same suitable for increasing its tolerance and packing density are disclosed, the semiconductor device including a semiconductor substrate having a field region placed lower than surface of an active region; an isolation layer formed at the field region; a gate insulating layer and a gate electrode successively formed over the active region; and impurity regions formed in the exposed active region at both sides of the gate electrode.

7 Claims, 8 Drawing Sheets

METHOD FOR FABRICATING FIELD EFFECT TRANSISTOR

BACKGROUND OF THE INVENTION

1. Field of the Invention

The present invention relates to a semiconductor device and, more particularly, to a semiconductor device and a method for fabricating the same suitable for increasing its tolerance and packing density.

2. Discussion of the Related Art

Since high integration densities have been required, many methods are being suggested in which the packing density of a semiconductor device is heightened. Among them, one is often used in which a width of a gate electrode is reduced. This method has problems that it is hard to prevent punch-through and that short channel effect is easily generated so that the reliability becomes deteriorated. Accordingly, a method for increasing the tolerance as well as packing density of a semiconductor device is desired.

A conventional semiconductor device and a method for fabricating the same will be described below with reference to the accompanying drawings.

FIG. 1A is a plan view of a semiconductor device and FIG. 1B is a cross-sectional view taken along line I—I of FIG. 1A.

As shown in FIGS. 1A and 1B, a shallow trench isolation (STI) region 2 is formed beneath the surface of a semiconductor substrate 1 at a field region. A gate oxide film 3 and a gate electrode 4 are formed, stacked in a direction on the semiconductor substrate 1 at an active region. A sidewall spacer 6 having a predetermined thickness is formed on the sides of the gate electrode 4. Lightly doped impurity regions 5 are formed beneath the surface of the semiconductor substrate 1 under the sidewall spacer 6. Source and drain regions 7a and 7b are formed beneath the surface of the semiconductor substrate 1 at both sides of the gate electrode 4 and its sidewall spacers 6. Silicide layers 8a are formed on the gate electrode 4 and on the source and drain regions 7a and 7b.

A conventional method for fabricating a semiconductor device will be described with reference to the accompanying drawings.

As shown in FIG. 2A, field and active regions are defined in a semiconductor substrate 1, and then shallow trenches are formed at the semiconductor substrate 1 of the field region. Next, an oxide film is deposited on the shallow trenches and a polishing process is then subjected to the oxide film for the purpose of planarization, thus forming shallow trench isolation regions 2.

A thin oxide film is formed by performing a thermal oxidation process over the entire surface. A polysilicon layer is coated on the oxide film. Subsequently, the polysilicon layer and the oxide film are anisotropically etched by using a gate-forming mask, thus forming a gate oxide film 3 and a gate electrode 4. At this time, the width of the gate electrode 4 should be narrower than that of a general gate electrode in order to increase the packing density of the semiconductor device.

As shown in FIG. 2B, with the gate electrode 4 serving as a mask, ions are lightly implanted into the active region, thus forming LDD regions 5. Thereafter, A chemical vapor deposition (CVD) process is performed to the entire surface to deposit either an oxide film or a nitride film and an anisotropical etching process is subjected to form sidewall spacer 6 surrounding the side of the gate electrode 4.

As shown in FIG. 2C, with the sidewall spacer 6 and the gate electrtode 4 serving as masks, source and drain regions 7a and 7b are formed in the active region at both side of the gate electrode 4. Thereafter, a metal layer 8 made of, for example, Ti, Co, Mo, or Ni is deposited so that it reacts with silicon layer to form silicide.

As shown in FIG. 2D, an annealing process is performed to form silicide layers 8a on the source and drain regions 7a and 7b and the gate electrode 4. Thereafter, the metal layer 8 that doesn't turn silicide is removed.

A conventional semiconductor device and a conventional method for fabricating the same have problems. Since the width of a gate electrode is reduced too much for the high integration of a semiconductor device, it is difficult to accomplish good reliability.

SUMMARY OF THE INVENTION

Therefore, the present invention is directed to a semiconductor device and a method for fabricating the same that substantially obviates one or more of problems due to limitations and disadvantages of the related art.

An object of the invention is to provide a semiconductor device and a method for fabricating the same suitable for increasing its tolerance and high packing density.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate having a field region placed lower than surface of an active region; an isolation layer formed at the field region; a gate insulating layer and a gate electrode successively formed over the active region; and impurity regions formed in the exposed active region at both sides of the gate electrode.

In another aspect of the present invention, a method for fabricating a semiconductor device includes the steps of defining field and active regions in a semiconductor substrate and forming isolation layers of as high as surface of the semiconductor substrate at the field region; successively forming a gate insulating layer and a gate electrode on the semiconductor substrate of the active region; forming sidewall spacer on sides of the gate electrode and simultaneously etching the isolation layers by a predetermined depth; and forming impurity regions beneath surface of the semiconductor substrate at both sides of the gate electrode to extend to the isolation layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

A semiconductor device and a method for fabricating the same will be described with reference to the accompanying drawings.

Figure 1A:
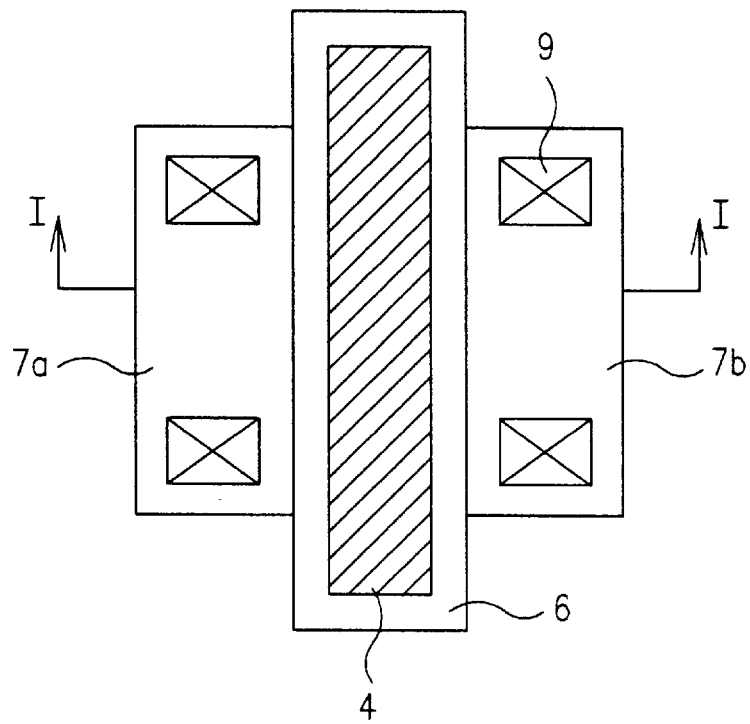
FIG. 1A is a plan view of a conventional semiconductor device.
Figure 1B:
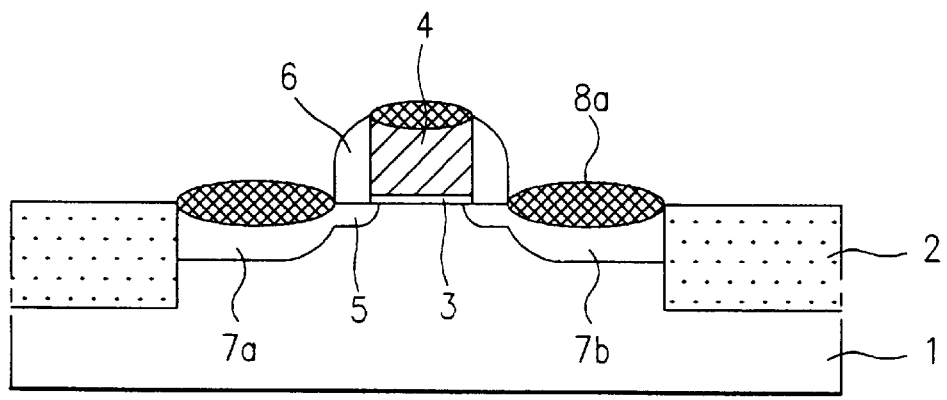
FIG. 1B is a cross-sectional view taken along line I—I of FIG. 1A.
Figure 2A:
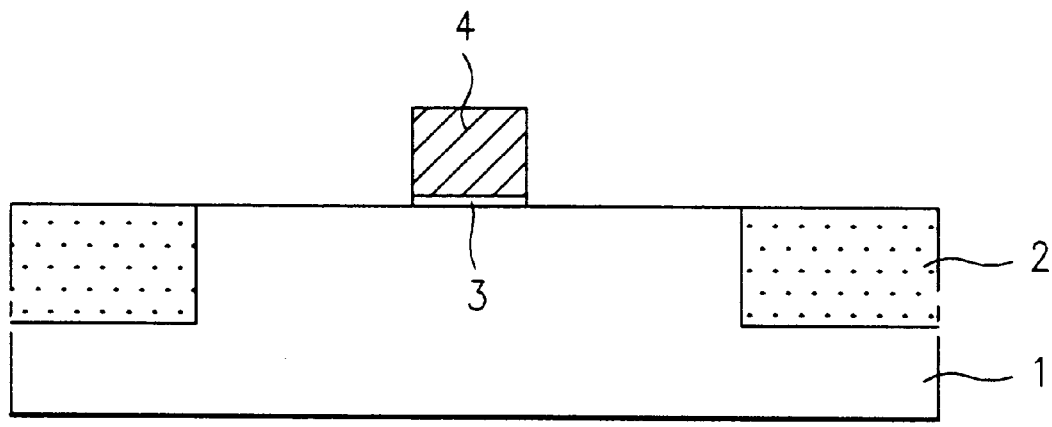
FIGS. 2A to 2D are cross-sectional views showing process steps of a method for fabricating the semiconductor device, taken along line I—I of FIG. 1A.
Figure 2B:
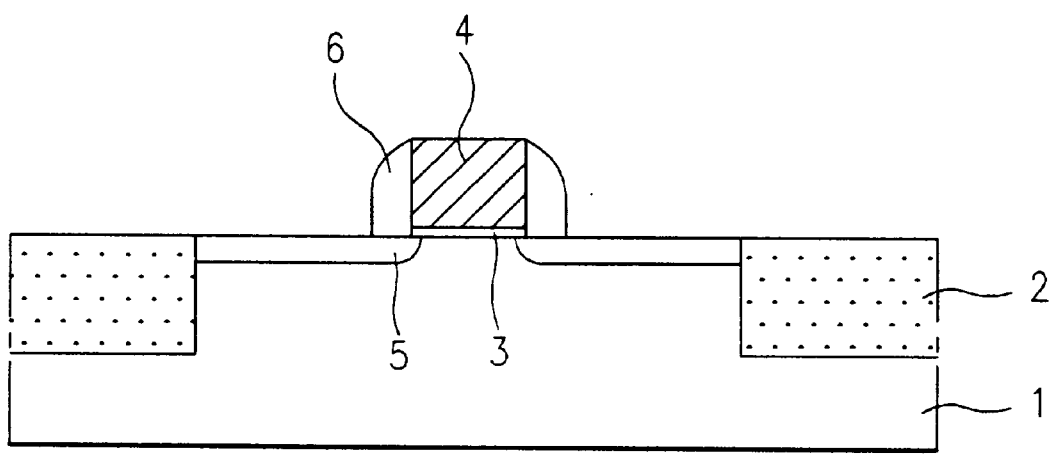
Figure 2C:
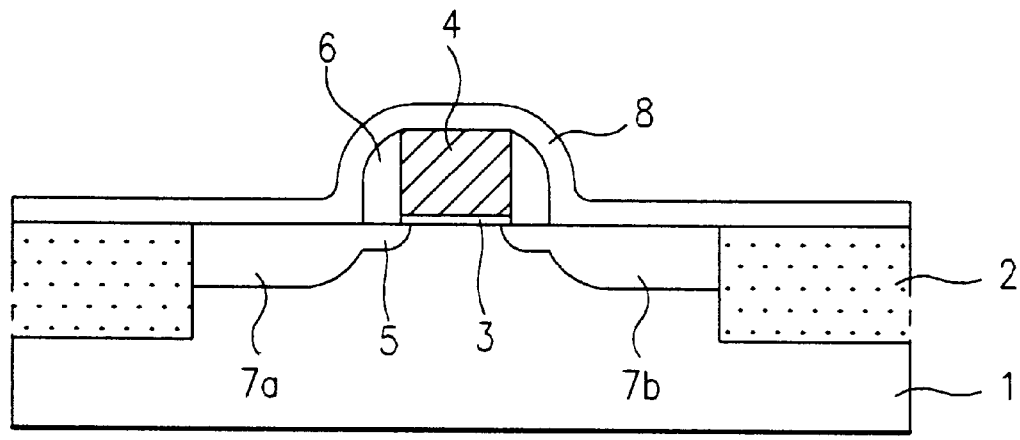
Figure 2D:
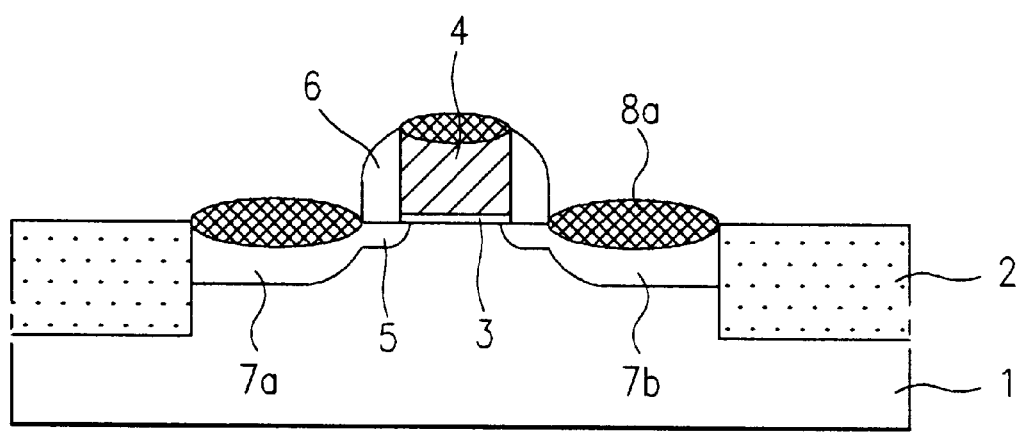
Figure 3A:
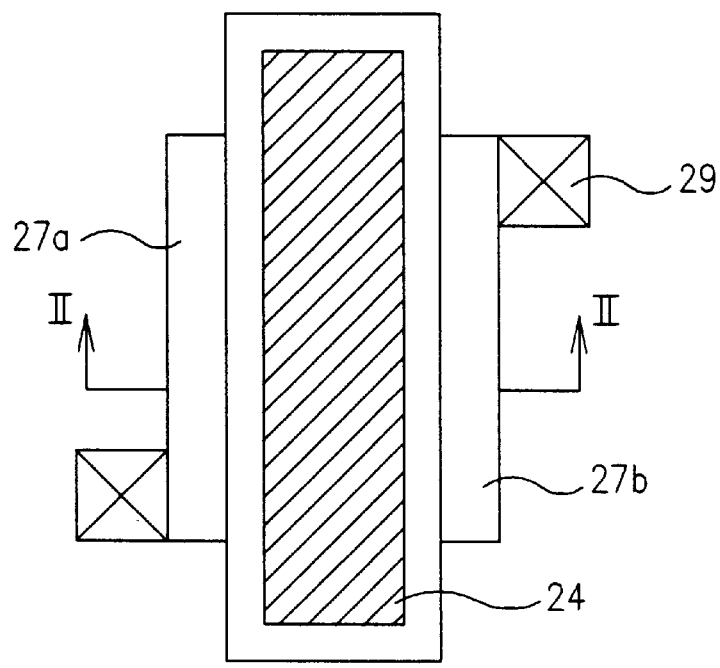
FIG. 3A is a plan view of a semiconductor device according to the present invention.
Figure 3B:
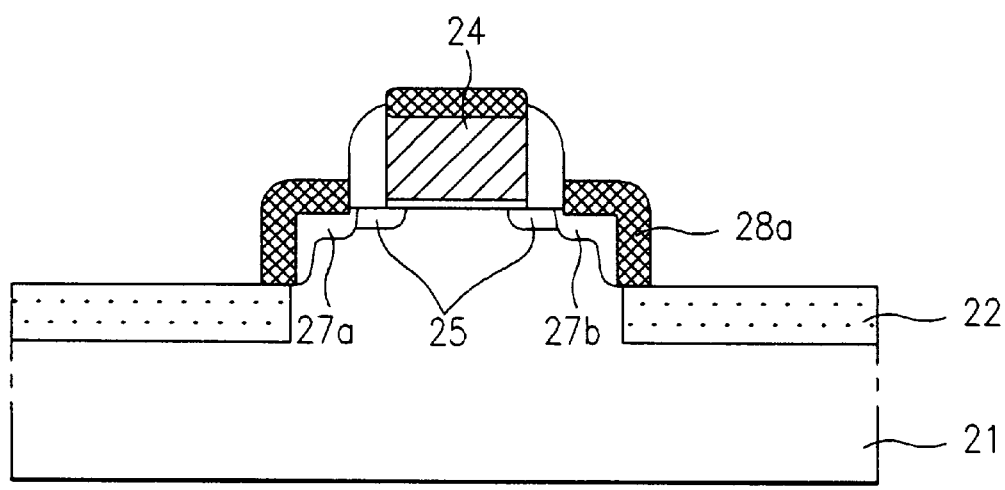
FIG. 3B is a cross-sectional view, taken along line II-I of FIG. 3A.

FIG. 3A is a plan view of a semiconductor device according to the present invention; FIG. 3B is a cross-sectional view, taken along line II-I of FIG. 3A; FIGS. 4A to 4D are cross-sectional views showing process steps of a method for fabricating the semiconductor device, taken along line II—II of FIG. 3A, according to a first embodiment of the present invention; and FIGS. 5A to 5D are cross-sectional views showing process steps of a method for fabricating the semiconductor device according to a second embodiment of the present invention, taken along line II—II of FIG. 3A.

As shown in FIGS. 3A and 3B, shallow trench isolation (STI) regions 22 are formed in a semiconductor substrate 21 at a field region. These STI regions 22 are placed in a lower location than the surface of the semiconductor substrate 21 on which a gate electrode 24 is formed in order that one side of each of source and drain regions 27a and 27b is exposed. A gate oxide film 23 and a gate electrode 24 are formed to be stacked in a direction on the semiconductor substrate 21 of an active region. A sidewall spacer 26 surrounds sides of the gate electrode 24. LDD regions 25 are formed under the sidewall spacer 26. Source and drain regions 27a and 27b are formed beneath surface of the semiconductor substrate 21 at both sides of the gate electrode 24 and extend to trench regions 22. Silicide layers 28a are formed on the gate electrode 24 and on the exposed source and drain regions 27a and 27b between the sidewall spacer 26 and the trench isolation regions 22.

A method for fabricating the semiconductor device in accordance with the first embodiment of the present invention will be explained.

Figure 4A:
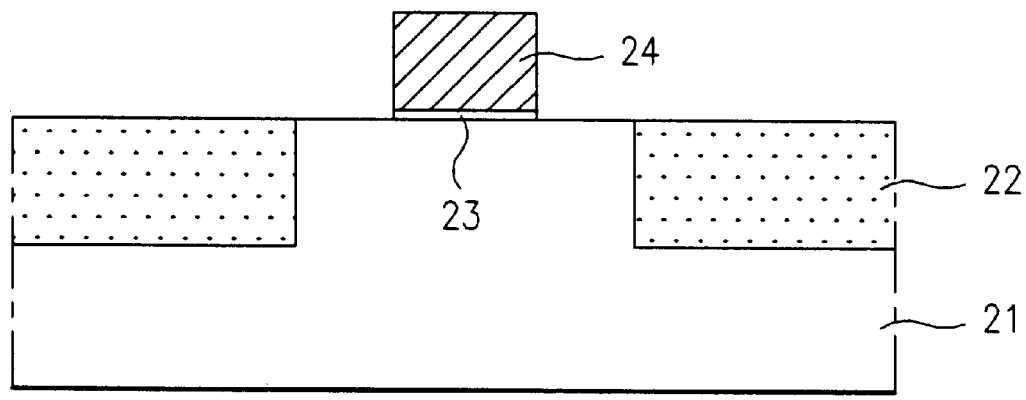
FIGS. 4A to 4D are cross-sectional views showing process steps of a method for fabricating the semiconductor device according to a first embodiment of the present invention, taken along line II—II of FIG. 3A.

Referring initially to FIG. 4A, field and active regions are defined in a semiconductor substrate 21 and shallow trenches are formed at the field region. An oxide film is deposited in the trenches and planarized, thus forming shallow trench isolation (STI) regions 22. At this time, instead of an oxide film, a nitride film can be deposited. Thereafter, after a polysilicon layer is deposited, the polysilicon layer and the oxide film are anisotropically etched, thereby stacking a gate oxide film 23 and a gate electrode 24.

Figure 4B:
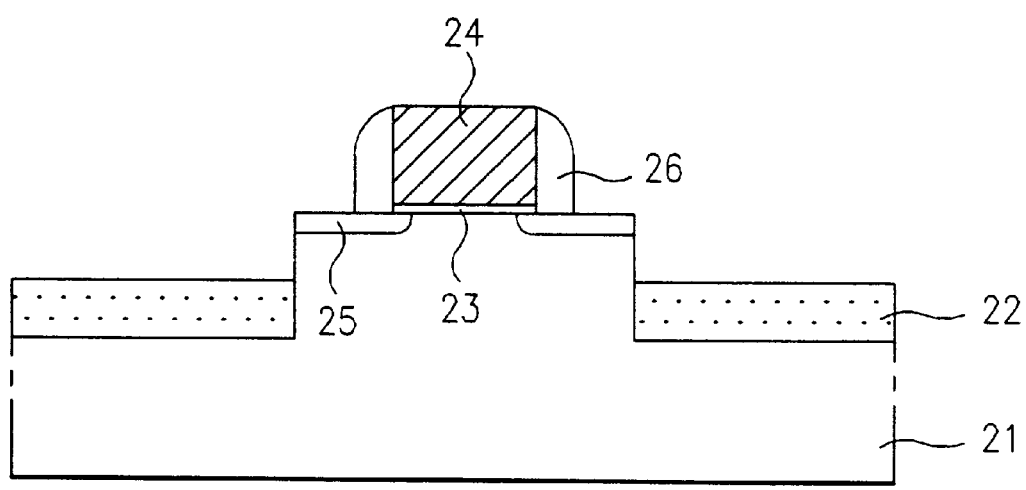

Referring to FIG. 4B, impurity ions are lightly implanted into the semiconductor substrate 21 at both sides of the gate electrode, thereby forming LDD regions 25. Next, either an oxide film or a nitride film is deposited and then anisotropically etched to form sidewall spacer 26 on sides of the gate electrtode 24. At the same time as the sidewall spacer 26 is formed, shallow trench isolation regions 22 are etched by a predetermined depth, thus exposing the sides of the semiconductor substrate 21. In order to simultaneously etch the trench isolation regions and the sidewall spacer 26, they should be made of an identical material.

On the contrary they can be made of different materials. After depositing an oxide film or a nitride film on the semiconductor substrate 21, an anisotropic etch process is performed to form sidewall spacer 26 on sides of the gate electrode 24. Next, the trench isolation regions 22 are etched by a predetermined depth to expose the sides of the semiconductor substrate 21. In this case, For example, the sidewall spacers 26 and the trench isolation regions 22 are made of a nitride and an oxide, respectively. Part of the oxide layer is subjected to a wet etch to be removed.

Figure 4C:
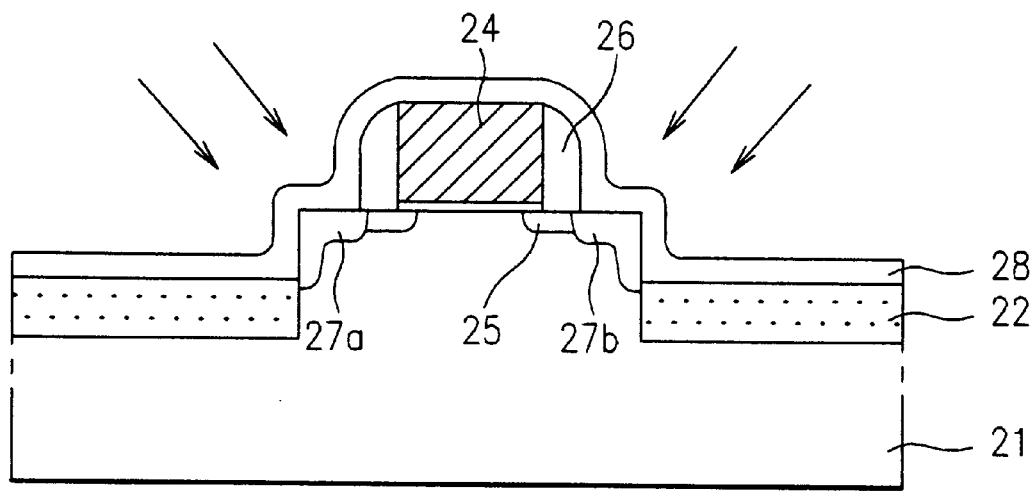

Referring to FIG. 4C, n-type impurity ions are tilt-implanted into the exposed semiconductor substrate 21. Subsequently, a thermal diffusion process is performed to form source and drain regions 27a and 27b. Thus, without reducing the width of the gate electrode 24, the width of the source and drain regions 27a and 27b are reduced two-dimensionally, thereby increasing the integrity density of the semiconductor device.

Figure 4D:
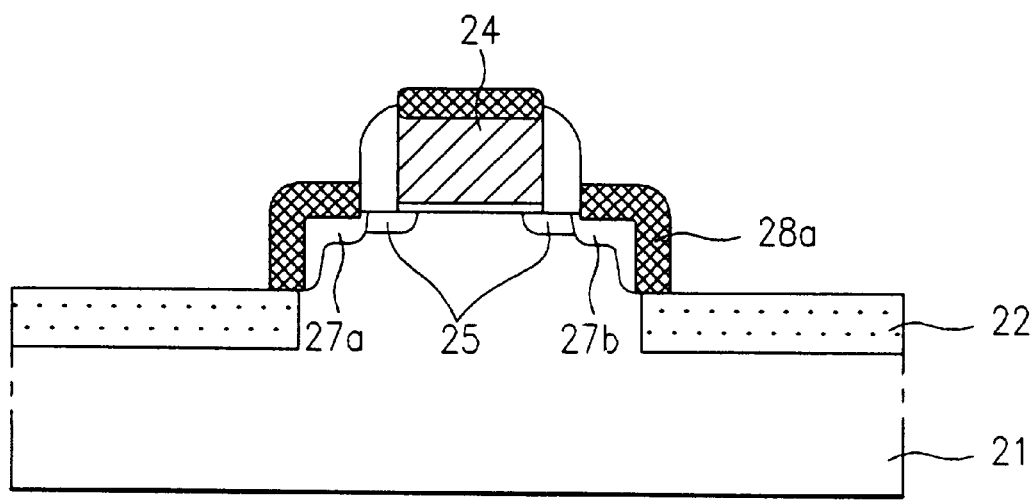

Referring to FIG. 4D, a metal layer 28 that will react with silicon layer to form silicide layers is deposited. For example, this metal layer 28 is made of any one of Ti, Co, Mo, and Ni. Thereafter, an annealing process is perfromed such that silicide layers 28a are formed on the gate electrode 24 and on the source and drain regions 27a and 27b. Then there is removed the metal layer 28 where silicide is not formed.

A method for fabricating a semiconductor device according to the second embodiment of the present invention will be described.

Figure 5A:
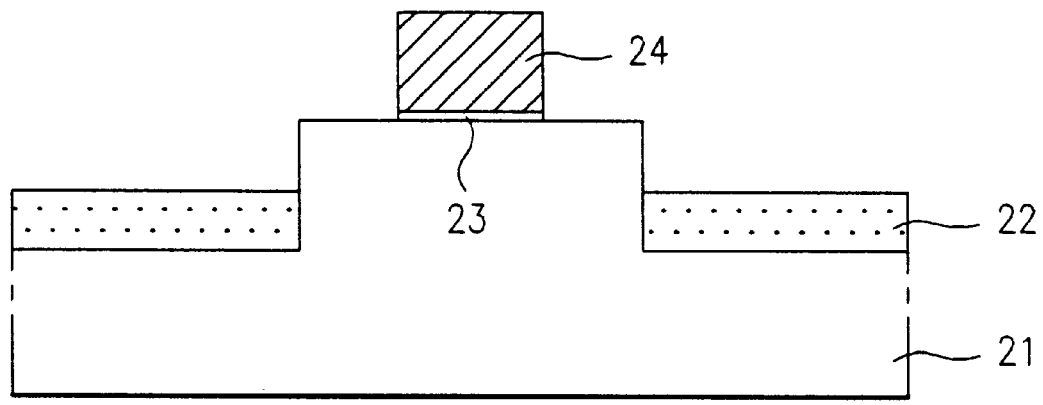
FIGS. 5A to 5D are cross-sectional views showing process steps of a method for fabricating the semiconductor device according to a second embodiment of the present invention, taken along line II—II of FIG. 3A.

Referring to FIG. 5A, after defining field and active regions, shallow trenches are formed and an oxide film is then deposited and planarized to form shallow trench regiones 22. In this case, a nitride film can be deposited instead of an oxide film. Thereafter, a polysilicon layer is deposited. Next, the polysilicon layer and the oxide film are anisotropically etched by using a gate-forming mask, thus forming a gate oxide film 23 and a gate electrode 24 which are stacked. Subsequently, part of the trench isolation regiones 22 is removed.

Figure 5B:
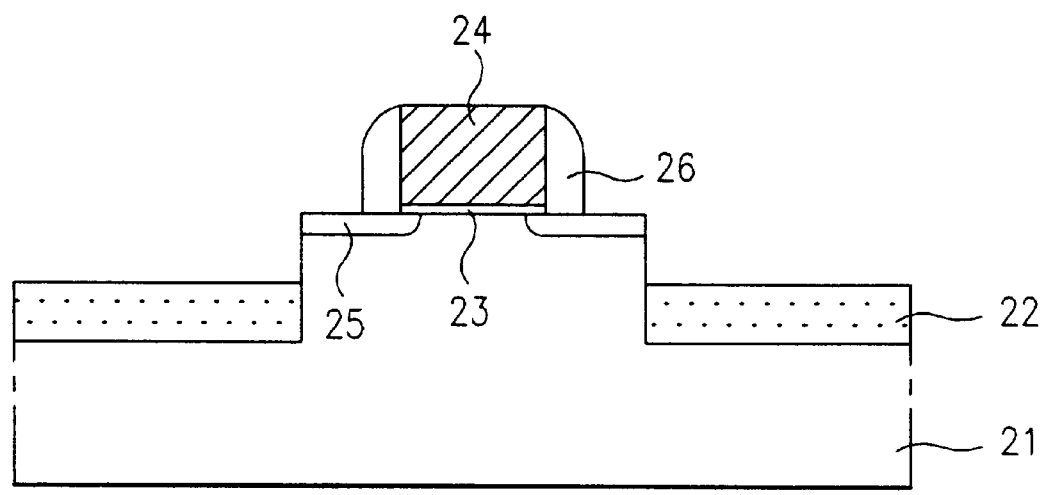

Referring to FIG. 5B, after forming either an oxide film or a nitride film on the semiconductor substrate 21, an anisotropical etch is performed to form sidewall spacer 26 on sides of the gate electrode 24.

Figure 5C:
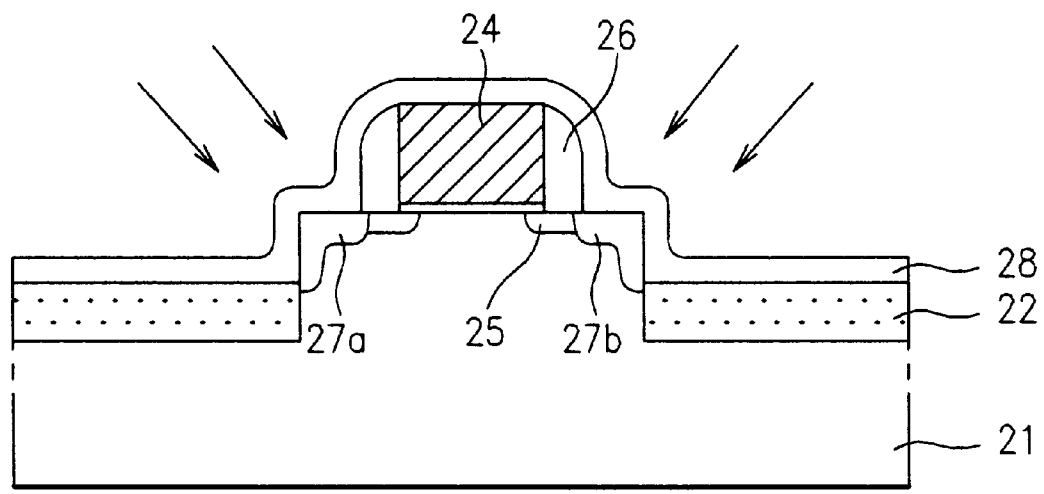
Figure 5D:
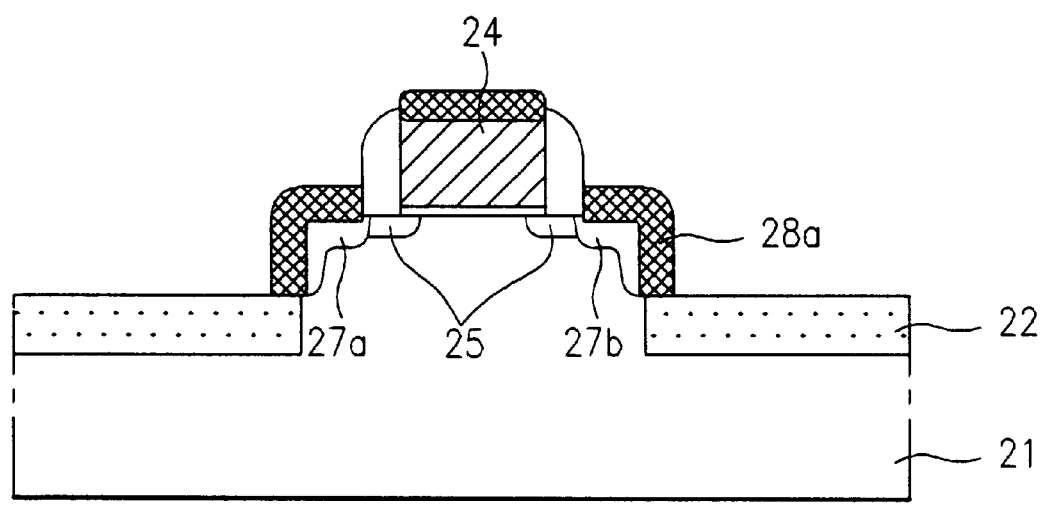

The process steps shown in FIGS. 5C and 5D are identical with those in FIGS. 4C and 4D.

A semiconductor device and a method for fabricating the same have the following advantages. First, since exposed semiconductor substrate at the sides of shallow trench isolation regions is used as an active region, the width of source and drain regions is not reduced with no reduction of the width of a gate electrode, thereby reducing a size of chip on layout without generation of short channel effect. Second, since silicide layer is formed to surround the sides of the shallow trench isolation regions, resistance of source and drain regions is reduced, thus occupying much resistance tolerance.

It will be apparent to those skilled in the art that various modification and variations can be made in the semiconductor device and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device comprising the steps of:

defining field and active regions in a semiconductor substrate and forming isolation layers of as high as surface of the semiconductor substrate at the field region;

successively forming a gate insulating layer and a gate electrode on the semiconductor substrate of the active region;

forming sidewall spacer on sides of the gate electrode and simultaneously etching the isolation layers; and forming impurity regions beneath surface of the semiconductor substrate at both sides of the gate electrode to extend to the isolation layer.

2. The method as claimed in claim 1, wherein the isolation layer is formed through the process step of forming a trench in the field region and the process step of depositing an insulating film in the trench.

3. The method as claimed in claim 1, wherein the impurity regions are formed by ion tilt-implanting process.

4. The method as claim in claim 1, further comprising the step of:

forming silicide layers on surface of the gate electrode and on the impurity regions.

5. A method for fabricating a semiconductor device comprising the steps of:

defining field and active regions and forming an isolation layer of as high as a semiconductor substrate of the field regions;

successively forming a gate insulating film and a gate electrode on the semiconductor substrate of the active region;

etching the isolation layer; and forming impurity regions beneath surface of the semiconductor substrate at both sides of the gate electrode to extend to the isolation layer.

6. The method as claimed in claim 5, wherein the impurity regions are formed by an ion tilt-implanting process.

7. The method as claimed in claim 5, further comprising the step of:

forming silicide layers on the impurity regions.

* * * * *